(12) United States Patent
Strickland et al.

(10) Patent No.: US 8,212,620 B2
(45) Date of Patent: Jul. 3, 2012

(54) BOOSTED-RAIL AMPLIFIER

(75) Inventors: James C. Strickland, Mesa, AZ (US); Mark D. Albers, Mesa, AZ (US); David Dean Baker, Gilbert, AZ (US)

(73) Assignee: Rockford Corporation, Tempe, AZ (US)

( * ) Notice: Subject to any disclaimer, the term of this patent is extended or adjusted under 35 U.S.C. 154(b) by 112 days.

(21) Appl. No.: 12/838,330

(22) Filed: Jul. 16, 2010

(65) Prior Publication Data

US 2011/0050349 A1 Mar. 3, 2011

Related U.S. Application Data

(60) Provisional application No. 61/238,065, filed on Aug. 28, 2009.

(51) Int. Cl.
*H03F 3/04* (2006.01)
(52) U.S. Cl. ........................................ 330/297
(58) Field of Classification Search ............... 330/127, 330/129, 297
See application file for complete search history.

(56) References Cited

U.S. PATENT DOCUMENTS

| 6,107,886 | A | 8/2000 | Kusakabe et al. |
| 6,885,225 | B2 * | 4/2005 | Ohmichi et al. ............... 327/112 |
| 7,728,663 | B2 * | 6/2010 | Rabjohn et al. ............ 330/124 R |
| 7,834,702 | B2 * | 11/2010 | Jones et al. ..................... 330/297 |
| 2002/0153940 | A1 * | 10/2002 | Wurcer et al. ................. 327/536 |
| 2005/0001687 | A1 | 1/2005 | Versteegen |
| 2006/0125554 | A1 | 6/2006 | Chen et al. |
| 2006/0284673 | A1 | 12/2006 | Peruzzi et al. |
| 2008/0192960 | A1 | 8/2008 | Nussbaum et al. |
| 2010/0237944 | A1 * | 9/2010 | Pierdomenico et al. ...... 330/261 |

* cited by examiner

*Primary Examiner* — Khanh V Nguyen
(74) *Attorney, Agent, or Firm* — Steptoe & Johnson LLP

(57) ABSTRACT

An amplifier device including an amplifier having an input for receiving an audio input signal and an output for sending an output signal to a load. A boosted-rail circuit is connected to a power source and has a single boosted rail connected to the BTL amplifier. Also, a common-mode circuit is coupled to the boosted-rail circuit and the BTL amplifier. The common-mode circuit sends a common-mode signal to the BTL amplifier that will dynamically track the output voltage supplied from the boosted-rail circuit to the BTL amplifier. In operation, the boosted-rail circuit reacts to the BTL amplifier and switches from a non-boost mode to a boost mode to increase the output voltage supplied to the BTL when the BTL amplifier requires additional voltage.

30 Claims, 9 Drawing Sheets

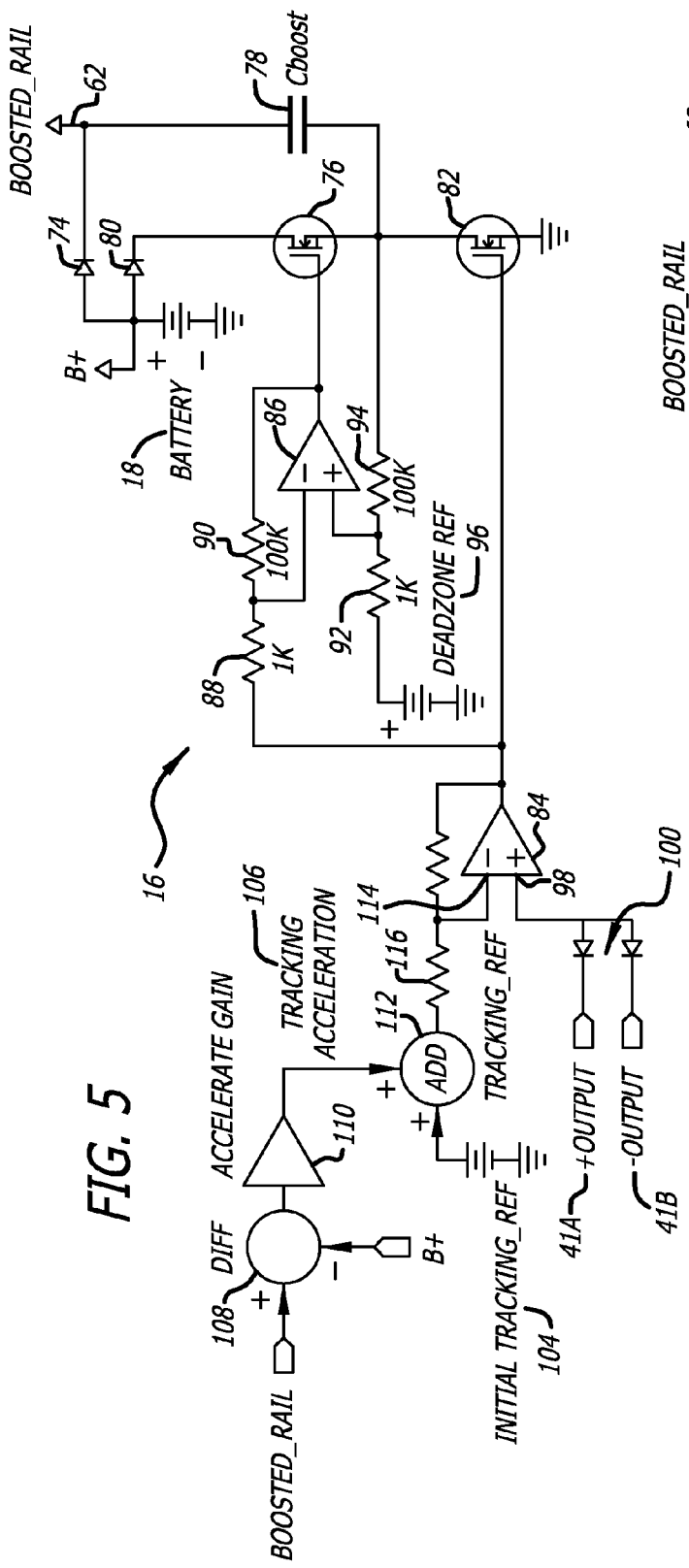
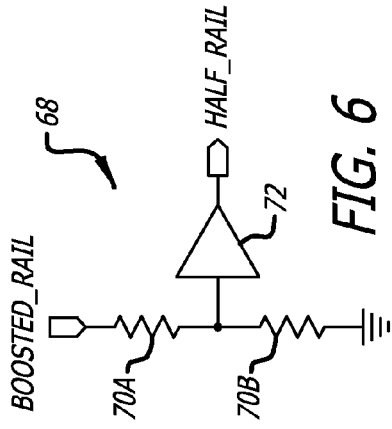
FIG. 5
FIG. 6

BOOSTED-RAIL AMPLIFIER

RELATED APPLICATION

This application claims the benefit of Provisional Application Ser. No. 61/238,065, which was filed Aug. 28, 2009 and is herein incorporated by reference in its entirety.

FIELD

Embodiments disclosed herein relate generally to the field of amplifiers, and more specifically to amplifiers having a boosted-rail to increase output power.

BACKGROUND

Amplifiers are devices that accept a varying input signal and produce an output signal that varies in the same way as the input, but with larger amplitude. The input and output signals may consist of a current, a voltage, a mechanical motion, or any other signal. An electronic amplifier is a device for increasing the power of a signal. It does this by taking power from a power supply and shaping the output to match the input signal. This process invariably introduces some noise and distortion into the signal, and the process is not completely efficient. Amplifiers always produce some waste as heat.

Different designs of amplifiers are used for different types of applications and signals. Amplifiers broadly fall into three categories: small signal amplifiers, low frequency power amplifiers, and RF power amplifiers. The most common types of amplifiers are electronic and have transistors or electron tubes as their principal components. Electronic amplifiers are widely used in consumer electronic devices, such as in radio and television transmitters and receivers, as well as audio and stereo systems.

Amplifiers in their simplest form are built around a single transistor. In one type of single-transistor amplifier, known as a common-emitter circuit, a varying input voltage is fed to the base of the transistor, and the output appears at the transistor's collector; the ratio of the output voltage to the input voltage is called the voltage gain. For many purposes a single transistor does not provide sufficient gain, or amplification. In a cascade, or multistage, amplifier, the output of the first amplifying device (transistor) is fed as input to the second amplifying device, whose output is fed as input to the third, and so on until an adequate signal amplification has been achieved. In a device such as a radio receiver, several amplifiers boost a weak input signal until it is powerful enough to drive a speaker. Usually, multistage amplifiers are not made of discrete components, but are built as integrated circuits. Another less common group of electronic amplifiers use magnetic devices as their principal components.

For use with automobile stereo systems, audio amplifiers typically have push-pull outputs, each leg of which is powered directly by a 12-volt car electrical system, which is actually 14.4 volts at full charge. This arrangement, allows each push-pull leg to output about 5 volts root mean square ("RMS") and summing to 10 volts RMS across the load. The load is "bridged" across the two amplifier stages, hence called a "bridge-tied-load" (BTL). With this type of push-pull amplifier, the 5 volts RMS output voltage is doubled to 10 volts RMS output voltage and the need for a power center-tap load-return is eliminated.

With this typical push-pull amplifier, if the speaker impedance $Z=1$ ohm, the power equation, $P=V^2/Z$, indicates that 100 watts of audio power is available to the speaker, which in an automobile stereo system is typically a sub-woofer optimized for low frequencies. In some applications more than 100 watts are needed, particularly when the speaker enclosure must be unusually small, as the exciting electrical power required goes inversely with box volume.

This initially appears to be a trivial problem as numerous high-frequency switching techniques utilizing transformers or charge-pumps are commonly employed for increasing supply voltage to amplifiers. However, for equipment supplied in new automobiles, the electromagnetic interference (EMI) generated by such supplies is considered unacceptable. Thus, with an automobile stereo system, one must do the best possible with the available 12 volts of voltage.

In most cases higher amplifier power has been produced by reducing speaker impedance to increase the amplifier output current. In some cases a dual voice coil can be driven by two separate BTL systems for an increase in power. With the peak current in the 1 ohm BTL system exampled above approaching 15 amperes, an attempt to obtain triple power by reducing the load impedance to 0.33 ohm, will result in approaching 45 amperes peak, whether in one voice coil, or summed for a dual-coil arrangement. Parasitic $i^2r$ losses are a serious problem for high-power approaches relying exclusively on current-boosting.

Accordingly, there is a need for systems and methods for increasing amplifier power in an efficient manner.

SUMMARY

Briefly, and in general terms, there is disclosed an amplifier device including an amplifier having an input for receiving an audio input signal and an output for sending an output signal to a load. The amplifier in one embodiment may be a bridge-tied-load ("BTL") amplifier that sends an output signal to a load such as speakers of an audio system. An audio signal processing circuit may be connected to the BTL amplifier for providing the audio input signal. A boosted-rail circuit is also disposed in the amplifier device, and the boosted-rail circuit is connected to a power source and has a boosted rail connected to the BTL amplifier. In one embodiment, the boosted-rail circuit only includes a single boosted rail that is connected to the BTL amplifier. Also, the single boosted rail operates at twice audio signal frequency. The boosted-rail circuit supplies an output voltage to the BTL amplifier through the boosted rail in a non-boost or normal mode and a boost mode for increasing the output voltage supplied to the amplifier.

The amplifier device also includes a common-mode circuit in communication with the boosted-rail circuit and the BTL amplifier. The common-mode circuit sends a common-mode signal to the BTL amplifier that will dynamically track the output voltage supplied from the boosted-rail circuit to the BTL amplifier. In one embodiment, the common-mode signal is one-half the amplitude of the voltage supplied from the boosted-rail circuit to the BTL amplifier. Tracking the output voltage from the boosted-rail circuit to the BTL amplifier allows the BTL amplifier operation to remain centered between ground and the output voltage from the boosted-rail for maximum unclipped output at all boost levels.

In operation, the boosted-rail circuit of the amplifier device reacts to the BTL amplifier and switches from the non-boost mode to the boost mode to increase the output voltage supplied to the BTL amplifier beyond the voltage of the power source when the BTL amplifier requires additional voltage. In one embodiment, the boosted-rail circuit switches from the non-boost mode to the boost mode when the boosted-rail circuit detects that one output signal from the BTL amplifier is near clipping. The boosted-rail circuit may include an error amplifier that detects when one output signal from the BTL amplifier is near clipping. It is possible to set the amplifier device so that the boosted-rail circuit operates in the boost mode when one output signal from the BTL amplifier is within a non-boost clipping headroom, which can be set to approximately 1.0 volt. In another embodiment, the boosted-rail circuit of the amplifier device reacts to the audio input signal received by the BTL amplifier and switches from the non-boost mode to the boost mode when the BTL amplifier requires additional voltage. In yet another embodiment, the boosted-rail circuit of the amplifier device may react to the drive signal to output devices in the BTL amplifier and switches from the non-boost mode to the boost mode when the BTL amplifier requires additional voltage.

Also, the boosted-rail circuit reacts to the BTL amplifier and switches from the boost mode to the non-boost mode when the increased output voltage is no longer needed. In one embodiment, switching from the boost mode to the non-boost mode occurs when the output signal produced by the BTL amplifier has a voltage slightly less than the voltage of the power source. In another embodiment, the boosted-rail circuit of the amplifier device reacts to the audio input signal received by the BTL amplifier and switches from the boost mode to the non-boost mode when the BTL amplifier no longer requires additional voltage. In yet another embodiment, the boosted-rail circuit of the amplifier device may react to the drive signal to output devices in the BTL amplifier and switches from the boost mode to the non-boost mode when the BTL amplifier no longer requires additional voltage.

The boosted-rail circuit includes a boost capacitor to provide additional energy to the BTL amplifier through the boosted-rail when the boosted-rail circuit is in the boost mode. The boost capacitor charges when the boosted-rail circuit is in the non-boost mode. There may also be circuitry included in the boosted-rail circuit for monitoring and preventing the boosted-rail circuit from simultaneously operating in the boosted mode and charging the boost capacitor.

Also, in general terms, there is disclosed a method for increasing the voltage of an amplifier. The method includes sending an audio signal to an amplifier, such as a BTL amplifier, and sending an output signal from the BTL amplifier to a load. The load may be speakers of audio system. An output voltage is supplied from a boosted-rail circuit having a boosted-rail to the BTL amplifier in a non-boost or normal mode and a boost mode. In one embodiment, the boosted-rail circuit includes a single boosted rail connected to the BTL amplifier. The boosted-rail circuit is connected to a power source, such as a battery. Also, the method includes monitoring the BTL amplifier with the boosted-rail circuit and switching the boosted-rail circuit from the non-boost mode to the boost mode to increase the output voltage to the BTL amplifier beyond the voltage of the power source when the BTL amplifier requires more output voltage. In one embodiment, switching the boosted-rail circuit from the non-boost mode to the boost mode occurs when the boosted-rail circuit detects that one output from the BTL amplifier is near clipping. In another embodiment, the boosted-rail circuit can monitor the audio signal to the BTL amplifier and switch from the non-boost mode to the boost mode when the BTL amplifier requires more output voltage. Also, a drive signal to an output device in the BTL amplifier can be monitored to detect clipping and switch the boosted-rail circuit from the non-boost mode to the boost mode.

The method of one embodiment may also include sending a common-mode signal to the BTL amplifier for dynamically tracking the output voltage supplied from the boosted-rail circuit to the BTL amplifier. The common-mode signal is one-half the amplitude of the output voltage supplied from the boosted-rail circuit to the BTL amplifier. Tracking the output voltage from the boosted-rail circuit to the BTL amplifier allows the BTL amplifier operation to remain centered between ground and the output voltage from the boosted-rail for maximum unclipped output at all boost levels.

Further, the method includes charging a boost capacitor disposed in the boosted-rail circuit when supplying the output voltage to the BTL amplifier in the non-boost mode. When increasing the output voltage from the boosted-rail circuit in the boost mode to the BTL amplifier, the additional energy is supplied from the boost capacitor to the BTL amplifier.

Other features and advantages will become apparent from the following detailed description, taken in conjunction with the accompanying drawings, which illustrate by way of example, the features of the various embodiments.

BRIEF DESCRIPTION OF THE DRAWING

FIG. 5 depicts a boosted-rail circuit of the boosted-rail amplifier;

FIG. 6 depicts a half-rail circuit that is coupled to the boosted-rail circuit of FIG. 5 and the half-rail circuit produces a common-mode signal to dynamically track the power supply from the boosted-rail circuit at one-half the amplitude;

DETAILED DESCRIPTION

The various embodiments described below are provided by way of illustration only and should not be construed to limit the claimed invention. Those skilled in the art will readily recognize various modifications and changes that may be made to the disclosed embodiments without departing from the scope of the claimed invention. By way of non-limiting example, it will be appreciated by those skilled in the art that particular features or characteristics described in reference to one figure or embodiment may be combined as suitable with features or characteristics described in another figure or embodiment. Further, those skilled in the art will recognize that the devices, systems, and methods disclosed herein are not limited to one field.

Figure 1:
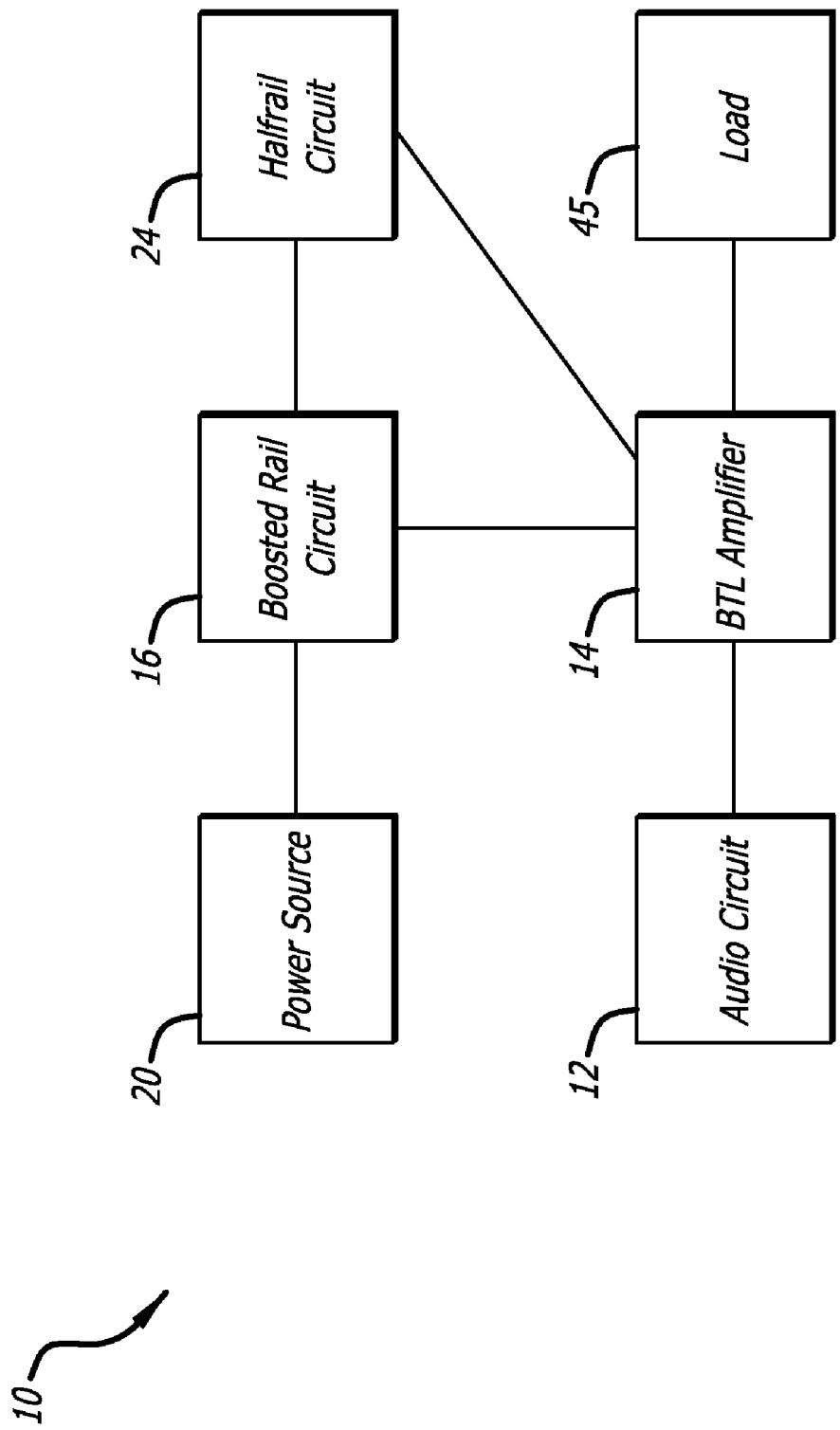
FIG. 1 depicts a block diagram of one embodiment of a boosted-rail amplifier coupled with a power source.

FIG. 1 shows a boosted-rail amplifier 10 that produces more power at a higher efficiency than a standard amplifier. The boosted-rail amplifier includes an audio signal processing circuit 12 that receives an audio signal from an audio source (not shown). A processed signal from the audio signal processing circuit is sent to a bridge-tied load ("BTL") amplifier 14. The BTL amplifier is preferably a class A/B amplifier 14A (see FIG. 3) or class D amplifier 14B (see FIG. 4). However, other amplifier classes can also be used, such as classes A, B, and E. A boosted-rail circuit 16 is connected to the amplifier and supplies the BTL amplifier with power. Power is supplied to the boosted rail circuit from a battery 18, which is connected to a battery circuit 20 that produces a battery voltage (B+) and half of the battery voltage (HALF_B+). When the boosted-rail circuit is activated into a boosted configuration, the boosted-rail circuit supplies the BTL amplifier with additional voltage that goes beyond the voltage of the battery. The power output of the boosted rail circuit is also connected to a half-rail circuit 24 which functions to halve the voltage output from the boosted rail circuit and produce a half rail output (HALF_RAIL).

The boosted-rail amplifier 10 achieves greater output power by boosting its supply voltage and current equally. In one embodiment, the boosted-rail amplifier 10 provides a voltage boost of 2:1 (doubles the voltage). If the speaker impedance Z=1 ohm and power $P=V^2/Z$, then use of the boosted-rail amplifier results in a power boost of 4:1 (quadruples the power).

A second cooperative improvement of the boosted-rail amplifier 10 is that the configuration is easily arranged to run in a more efficient Class G and H modes, which are known in the art. Combining the efficiency of the dual-mode voltage/current boost and that of Class G/H operation allows a high-power, 12 volt amplifier of considerably higher efficiency than those of present art.

Boosted-rail amplifier 10 may be used for any electrical system that requires amplification, such as wireless communications devices, control systems, and consumer electronics. The amplification of music for home or car audio systems is one exemplary use of the boosted-rail amplifier 10. Other exemplary uses include the amplification of an audio signal emitted from a cell phone, portable music player, radio, CD player, tape player, DVD player, MP3 player, or any battery powered portable device.

In one embodiment, the boosted-rail amplifier 10 is capable of operating off a single DC power supply such as a standard automotive battery-based bus of nominally 12 volts. Additional batteries may be added to the car audio electrical system to provide more power to the system. In other automotive embodiments, power can be supplied from the battery, a conventional car alternator or both. Still further, in other embodiments, any type of battery, including a 9 volt battery, may be used with the boosted-rail amplifier 10.

Figure 2:
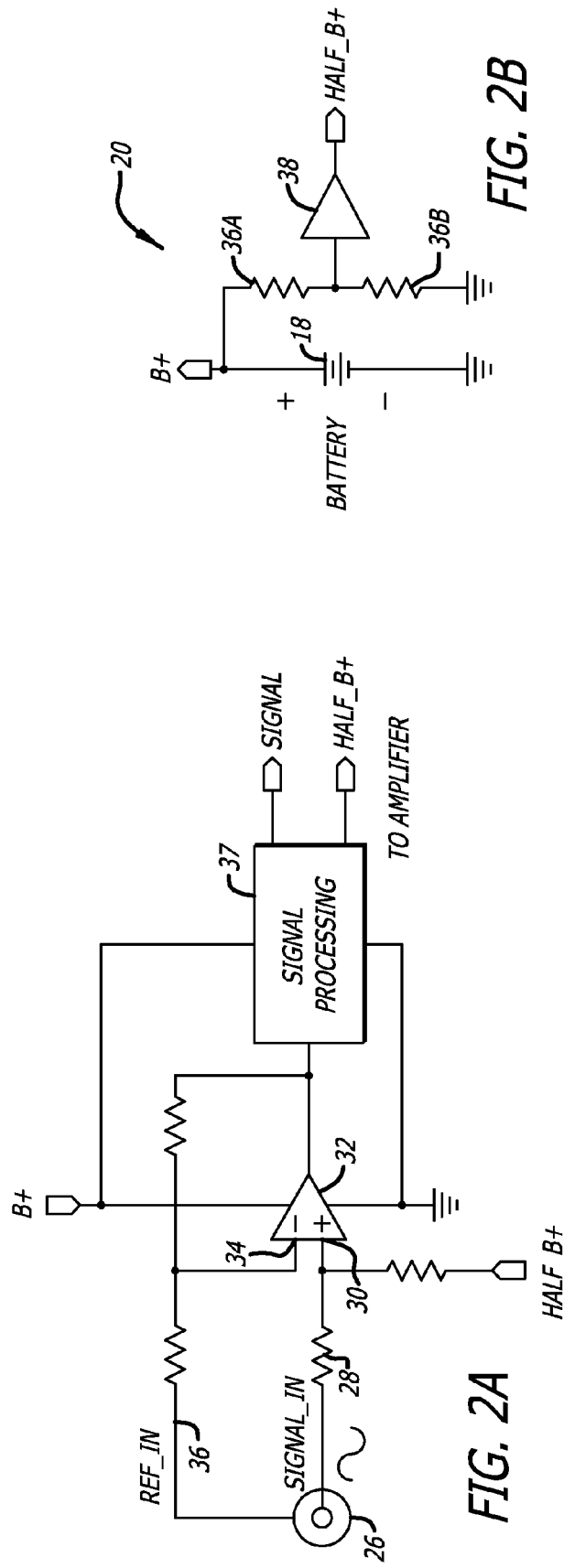
FIG. 2A depicts an audio signal processing circuit of the boosted-rail amplifier.
FIG. 2B depicts a battery circuit connected to a battery that produces a DC bias voltage.

Typically, an audio amplifier will require some audio signal processing in front of the amplifier. FIG. 2A shows the standard audio signal processing circuitry 12 employing standard operational amplifiers powered from the battery 18 of a typical automotive electrical system. In order to process the AC audio waveform through the circuits of the audio signal processing circuit, a DC bias voltage HALF_B+ can be created by the battery circuit 20 shown in FIG. 2B at one-half the voltage of the battery 18. This DC bias voltage is used as a virtual ground throughout the audio signal processing circuitry so that a single DC power supply can be used to process the AC audio waveform using standard operational amplifiers.

The audio signal processing circuitry 12 shown in FIG. 2A includes an audio input 26 for accepting the audio waveform that follows a signal path 28 to a non-inverting input 30 of a common amplifier 32. An inverting input 34 of the amplifier 32 is connected to a reference path 36. Also, the DC bias voltage HALF_B+ is connected to the signal path 28. The common amplifier 32 is connected to signal processing circuitry 37 that outputs a differential audio signal (SIGNAL and HALF_B+) to the BTL amplifier 14.

FIG. 2B shows the battery circuitry 20 including the battery 18 in connection with two equal value resistors 36A and 36B. The two equal value resistors 36A and 36B are connected to a unity gain buffer 38 that outputs the DC bias voltage HALF_B+.

Figure 3:
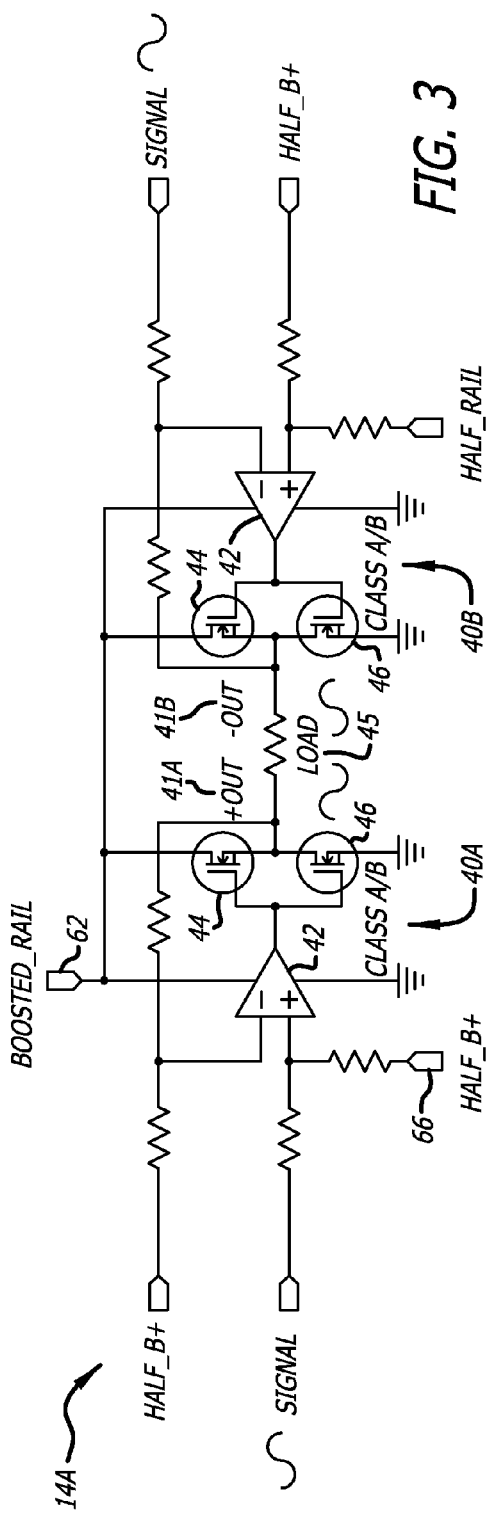
FIG. 3 depicts a Class AB bridge-tied-load amplifier of one embodiment of a boosted-rail amplifier.

FIG. 3 shows the class AB increased voltage-range BTL amplifier 14A of one embodiment. It is composed of two independent half-bridge amplifiers, one inverting 40A and one non-inverting 40B, so that the differential outputs +OUT 41A and −OUT 41B will produce a signal amplitude that is twice that of each half-bridge amplifier alone. In the class AB amplifier shown in FIG. 3, each half-bridge includes a differential amplifier 42 that is connected to a high side MOSFET 44 and a low side MOSFET 46. The output of the BTL amplifier is coupled to a load 45. Load is the output section of the audio system that includes speakers.

Figure 4:
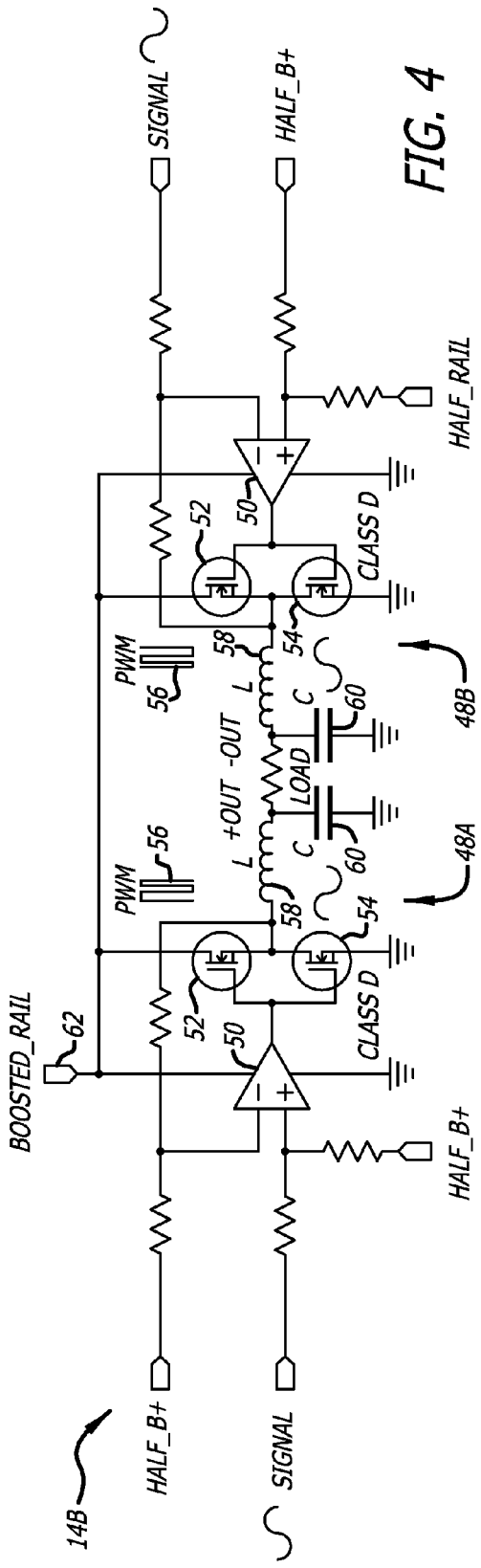
FIG. 4 depicts a Class D bridge-tied-load amplifier of another embodiment of a boosted-rail amplifier.

In another embodiment, the BTL amplifier 14 is a class D amplifier 14B as shown in FIG. 4. Similar to the class AB amplifier 14A, the class D amplifier 14B is composed of two independent half-bridge amplifiers, one inverting 48A and one non-inverting 48B, so that the differential output +OUT and −OUT will produce a signal amplitude that is twice that of each half-bridge amplifier alone. In the class D amplifier shown in FIG. 4, each half-bridge includes a pulse-width-modulating amplifier 50 that is connected to a high side MOSFET 52 and a low side MOSFET 54. As indicated in FIG. 4, the class D amplifier 14B produces a pulse width modulation (PWM) equivalent of the analog input signal which is fed to the load via a filter network to block the carrier and recover the original audio. The output filter is an LC circuit formed by an inductor 58 and capacitor 60. The output of the BTL amplifier 14B is coupled to a load 61. Load is the output section of the audio system that includes speakers.

The class D amplifier 14B may be better suited for applications where electromagnetic interference (EMI) is not as critical as power efficiency. Using the class D amplifier would result in significant improvements in overall efficiency when compared to the class AB amplifier 14A. The boosted-rail circuit 16 is a good choice for the high-voltage supply of the class D amplifier 14B in that the signal based voltage boost does not present the aliasing noise problems that might be present with a switch-mode power supply. The signal based operation of the boosted-rail circuit 16 may also present some cost and performance advantages over a switch-mode power supply in meeting the requirements of certain conducted emissions tests for various countries or OEM applications.

Although either the class AB or class D amplifiers can be used in the boosted-rail amplifier 10, the following description will be made only to the class AB amplifier 14A. As shown in FIG. 3, a power supply connection 62 (BOOSTED_RAIL) is provided from the boosted-rail circuitry 16 of FIG. 5. The boosted-rail circuitry 16 will react to the audio signal and increase the voltage of the power supply BOOSTED_RAIL beyond the voltage of the battery 18 when needed to achieve increased output voltage. When the power supply is boosted beyond the voltage of the battery, the boosted-rail amplifier 10 is in a boosted mode, and when the power supply is not boosted beyond the voltage of the battery, the boosted-rail amplifier is in a non-boost or normal mode.

The differential audio input signal to the BTL amplifier (SIGNAL and HALF_B+) is delivered from the audio signal processing circuitry 12 shown in FIG. 1. Also, a third input signal to the BTL amplifier is the "common-mode" signal 66 (HALF_RAIL). Normal idle common-mode voltage of the BTL amplifier 14, which is typically 6-7 volts, must be modulated to track at half of the boosted rail value. This allows the BTL operation to remain centered between ground and the boosted-rail value for maximum unclipped output at all boost levels. As shown in FIG. 3, the signal HALF_RAIL will dynamically track the power supply BOOSTED_RAIL at exactly one-half amplitude. The purpose of this common-mode input signal HALF_RAIL is to keep the common-mode output of each half-bridge amplifier 40A and 40B at exactly half the amplitude of the dynamic BOOSTED_RAIL power supply. This insures that in all power supply conditions (boosted or non-boosted), the differential audio input signal will clip each half-bridge amplifier symmetrically on the high-side MOSFETS 44 and low-side MOSFETS 46 of the BTL amplifier 14.

The common-mode signal HALF_RAIL is produced by a half-rail circuitry 68 shown in FIG. 6, which receives the power supply BOOSTED_RAIL from the boosted-rail circuitry 16. Two equal value resistors 70A and 70B and a unity gain buffer 72 are included in the half-rail circuitry 68 to produce the signal HALF_RAIL.

It is the boosted-rail circuitry 16 shown in FIG. 5 that functions as the power supply for the BTL amplifier 14 by providing the high-voltage supply connection BOOSTED_RAIL 62. The supply connection 62 is a hardwire connection between the boosted-rail circuitry and the BTL amplifier. By monitoring the output signal of the BTL amplifier and power supply conditions, the boosted-rail circuitry 16 will cause BOOSTED_RAIL to dynamically track the output signal and "boost" this power supply beyond the BATTERY voltage when needed. In this embodiment, only one boosted-rail supplying the amplifier 14 is needed instead of two boosted-rails. This single boosted-rail operates at twice audio signal frequency ("2f"). The 2f signal is derived from rectification of the BTL amplifier outputs, and then applied to MOSFETS 76 and 82 of the boosted-rail circuitry 16.

When the output signals 41A and 41B (+OUT and −OUT) from the BTL amplifier 14 are at a voltage less than the voltage of the battery 18, power is delivered to the BTL amplifier from the battery 18 through diode 74 via the connection BOOSTED_RAIL 62. In this non-boost signal condition, the amplifier operates as a normal BTL amplifier, and each half-bridge output has a maximum voltage of the battery minus the voltage drops across diode 74 and the high-side MOSFET 44 of the BTL amplifier.

When the output signals 41A and 41B (+OUT and −OUT) need to go beyond the voltage of the battery 18, the boosted-rail circuitry 16 of FIG. 5 will dynamically track the signal demand for more voltage and boost the voltage of BOOSTED_RAIL by turning on a high side device represented by boost MOSFET 76. When MOSFET 76 is turned on, a storage capacitor Cboost 78 and the power supply BOOSTED_RAIL are lifted above the voltage of the battery 18. As soon as the BOOSTED_RAIL voltage has been lifted above the 0.7V diode drop of diode 74, power ceases to flow through diode 74 to the BTL amplifier and instead flows from the battery 18 through diode 80, boost MOSFET 76, and capacitor Cboost 78 to the BTL amplifier 14 via BOOSTED_RAIL connection 62. During this boost mode signal condition, all power sourced by the BTL amplifier is continuously draining the stored energy in capacitor Cboost. Since the BTL amplifier is totally dependent on this stored energy to provide power during the boost mode, the capacitance value of Cboost is necessarily a determining factor in the power rating and low-frequency audio range of the present invention.

In one embodiment, the minimum required boost capacitance for a 300 W/1Ω boosted-rail amplifier 10 can be estimated with the following equations. A conventional BTL amplifier connected directly to the battery would have the following sine wave output power, with BATT=14.4V and Rload=1Ω:

$$Pnormal = \frac{BATT^2}{2 \times Rload} = 104 \text{ W}$$

For the boosted-rail amplifier 10 with the boosted-rail circuitry 16, the maximum output voltage allowed in the non-boost mode can be determined by calculating the difference between available voltage from the battery through diode 74 and the chosen amount of non-boost clipping headroom Vnhr. With Vnhr=1V and Vdiode=0.4V, the maximum output voltage allowed in the non-boost mode is determined using the following equation:

$$Vboost = BATT - Vdiode - (2 \times Vnhr) = 12.0V$$

Let Vnhr=1V and Vdiode=0.4V Now choosing a power boost factor k, where k is greater than 1 and less than 4 of k=3 times, the boosted power and peak output voltage of the amplifier is:

$$Pboost = k \times Pnormal = 312W, Vpeak = \sqrt{2 \times Pboost \times Rload} = 24.9V$$

Assigning identical drop voltages for charging diode 80 and boost diode 74, and assuming no losses in charging MOSFET 82, the maximum possible BOOSTED_RAIL voltage will be the following, with Vdiode=0.4V:

$$Vmax = 2 \times (BATT - Vdiode) = 28.0V$$

It can now be seen that the boost capacitor Cboost 78 must not discharge too much voltage during the boost mode or there will not be enough BOOSTED_RAIL voltage to produce the desired peak output voltage Vpeak of the sine wave. Additional peak voltage losses in the output MOSFETs should be considered as well, and will be compensated for with an estimate of the boost clipping headroom Vbhr. The maximum allowable discharge voltage of the boost capacitor Cboost 78 at the end of the period of time beginning with the initiation of boost mode and ending at the peak output of the sine wave is, with Vbhr=1.5V:

$$Vdischarge = Vmax - Vpeak - Vbhr = 1.6V$$

Let $Vbhr=1.5V, Vdischarge=Vmax-Vpeak-Vbhr=1.6V$

Finally, choosing the minimum frequency Fmin that needs to be produced will determine the minimum required boost capacitance. If Fmin=100 Hz, then the required boost capacitance equals:

$$Cboost \geq \frac{\sqrt{Vpeak^2 - Vboost^2}}{2\pi \times Fmin \times Rload \times Vdischarge} = 0.022 = 22,000 \text{ uF}$$

In one example, the boosted-rail amplifier 10 was built around a complementary MOSFET BTL amplifier and the boost capacitance of Cboost was 30,000 uF. This example was able to achieve 300 W into a 1Ω load at low frequencies and with low total harmonic distortion ("THD").

Charging of the boost capacitor Cboost 78 takes place during non-boost mode, when MOSFET 76 is turned off.

Capacitor Cboost 78 is charged by turning on a low side device represented by charging MOSFET 82, allowing the battery 18 to charge capacitor Cboost through diode 74. When the BTL amplifier 14 requires less than the average power of the battery to amplify the audio signal, the excess power from the battery 18 is used to charge capacitor Cboost. In one embodiment, the MOSFETS 76 and 82 are n-channel MOSFETS.

The varying BTL amplifier 14 common-mode voltage HALF_RAIL dynamically changes the voltage at which the rail-boost pair transitions between charging and discharging capacitor Cboost 78. Even on a 2:1 maximum voltage rail-boost (beyond best operation), the charging time of capacitor Cboost does not fall below 60° of the sine period. When operation falls back into normal BTL amplifier range, the charge angle is 360° continuous.

The rail-boosting half-bridge represented by MOSFETS 76 and 82 in FIG. 5 should be precisely controlled to achieve maximum power efficiency and output signal integrity. The boosted-rail circuitry 16 must also avoid destructive cross-conduction currents as MOSFETS 76 and 82 are commutated to and from boost and non-boost modes.

As shown in FIG. 5, the boost-rail circuitry 16 is centered around error amplifier 84. When error amplifier 84 input conditions force the output high, it will turn on charging MOSFET 82, and recharge the boost capacitor Cboost 78. Once input conditions of the error amplifier 84 force the output low, an inverting high-side driver operation amplifier ("op-amp") 86 with gain resistors 88 90, 92 and 94 will turn on the boost MOSFET 76, and incrementally increase the voltage of the power output BOOSTED_RAIL so that the output voltage range of the BTL amplifier 14 is extended beyond the voltage of the battery 18. A voltage reference DEADZONE_REF 96 is set at a voltage that is safely below the turn-on threshold of charge MOSFET 82. This insures that error amplifier 84 cannot simultaneously turn on both MOSFETS 76 and 82, which would cause a destructive cross-conduction condition. The output voltage of the error amplifier 84 must go below DEADZONE_REF, thereby turning off MOSFET 82, before it can begin to turn on MOSFET 76. In one embodiment, the threshold to turn MOSFETS 76 and 82 on/off is set at about 2 volts, and the voltage of the DEADZONE_REF can be about 1.2 volts or about 1.4 volts (2 diode drops). Further, the error amplifier trips when the lowest output signal 41A or 41B is within the non-boost clipping headroom Vnhr, which in one embodiment is set to be approximately 1.0 volt. In other embodiments, the non-boost clipping headroom can be set less than 2.0 volts, and it is preferably set to be equal to or less than approximately 1.0 volt. It is preferred that the non-boost clipping headroom is set to be less than 1.0 volt to maximize power efficiency.

During the boost mode configuration of the boosted-rail amplifier 10, the power output BOOSTED_RAIL tracks the output signal at a slightly higher voltage. This insures that there is always sufficient power supply voltage at BOOSTED_RAIL to produce the desired output signal. The amount of headroom between the output signal and the tracking BOOSTED_RAIL is determined by inputs at the error amplifier 84. These inputs are the output signals +OUT and −OUT from the BTL amplifier 14. A non-inverting input 98 of the error amplifier 84 is connected to diode 100, which is a logic OR circuit. The diode 100 chooses the lowest of the two half-bridge outputs +OUT or −OUT. When either BTL amplifier output is nearly clipping its low-side device, the error amplifier output will go low and initiate the boost mode configuration by turning on MOSFET 76. The BTL amplifier 14 has been configured to include the common-mode input signal HALF_RAIL causing it to have symmetric high-side and low-side clipping. This assures that detection of the low-side clipping to initiate boost mode configuration also implies simultaneous high-side clipping. Use of the common-mode input signal HALF_RAIL helps to maximize power efficiency by avoiding boost transition until the BTL amplifier is approaching clipping, and has used as much of the battery voltage range as possible during normal non-boost operation.

The headroom voltage between the output signal and BOOSTED_RAIL is determined by the TRACKING_REF voltage 102 as shown in FIG. 5. The TRACKING_REF voltage is a sum of a fixed voltage INITIAL TRACKING_REF 104 (DC reference), and a variable voltage TRACKING ACCELERATION. During the transition from non-boost to boost mode configuration, the initial amount of headroom is equal to INITIAL TRACKING_REF. As the output signal increases, and BOOSTED_RAIL tracks along with it, the headroom is increased proportionally through the action of a TRACKING ACCELERATION circuit 106. The increasing power output BOOSTED_RAIL is measured against the fixed battery voltage B+ by the DIFF stage 108 and then proportioned by the ACCELERATE GAIN stage 110. In other words, the battery voltage B+ is subtracted from the BOOSTED_RAIL voltage and multiplied by a gain. This proportioned amount is then added to the INITIAL TRACKING_REF at a summing point 112 to produce the dynamic headroom reference TRACKING_REF. An inverting input 114 of the error amplifier 84 receives the TRACKING_REF through resistor 116. When the output signal (+OUT and −OUT) at the non-inverting input 98 is lower than TRACKING_REF, the error amplifier output goes low and initiates boost mode by turning on MOSFET 76.

Also, the boosted-rail circuit 16 reacts to the output signals 41A and 41B produced by the BTL amplifier and switches from the boost mode to the non-boost mode when the increased output voltage is no longer required. Switching from the boost mode to the non-boost mode occurs when the output signal produced by the BTL amplifier has a voltage slightly less than the voltage of the power source.

In other embodiments, the boosted-rail circuit may monitor other signals from the BTL amplifier to determine when to switch from the non-boost mode to the boost mode. In one embodiment, the boosted-rail circuit monitors the audio signal received by the BTL amplifier and switch from the non-boost mode to the boost mode when the BTL amplifier requires more output voltage. In yet another embodiment, a drive signal to an output device in the BTL amplifier, such as the high-side and low-side MOSFETS in the BTL amplifier, can be monitored to detect clipping and switch the boosted-rail circuit from the non-boost mode to the boost mode.

The purpose of the TRACKING ACCELERATION function is to have control over the power dissipation of boost MOSFET 76. If the tracking headroom of BOOSTED_RAIL is held closely to the output signal (+OUT and −OUT) by adding little or no amount of TRACKING ACCELERATION, the result will be a Class G-type operation, maximizing the dissipation on MOSFET 76 and minimizing the dissipation on the BTL amplifier high side and low side MOSFETs 44 and 46. If a larger proportion of TRACKING ACCELERATION is chosen, the boost action will almost immediately turn MOSFET 76 fully on after boost mode is initiated, resulting in a Class H-type operation. Since this Class H behavior will fully turn on boost MOSFET 76 during most of the boost mode, it will dissipate a minimal amount of power, passing more voltage and dissipation onto the BTL amplifier 14. By choosing the proportion of TRACKING ACCELERATION, the dissipation rating of the boost MOSFET 76 can be considered an isolated design issue.

As describe, in one embodiment, the boosted-rail amplifier 10 can be operated in two-step Class G, wherein the BTL rail is instructed to stay just above the positive value of each audio wave. If the system operates in Class G, nearly all additional dissipation will occur in the boosted-rail circuitry because the BTL amplifier drops minimal voltages at all times. If, in another embodiment, the system operates in (fast switching) Class H, the boosted rail circuitry will see little dissipation, but impose it largely on the BTL amplifier. However, an operation between Class G and Class H can be elected by dynamically controlling tracking headroom in the boosted rail circuitry. This moves some of the excess dissipation from the Class G operation back to the BTL amplifier stages, which is enough to balance the dissipation of all the boosted-rail and BTL amplifier stages.

Figure 7:
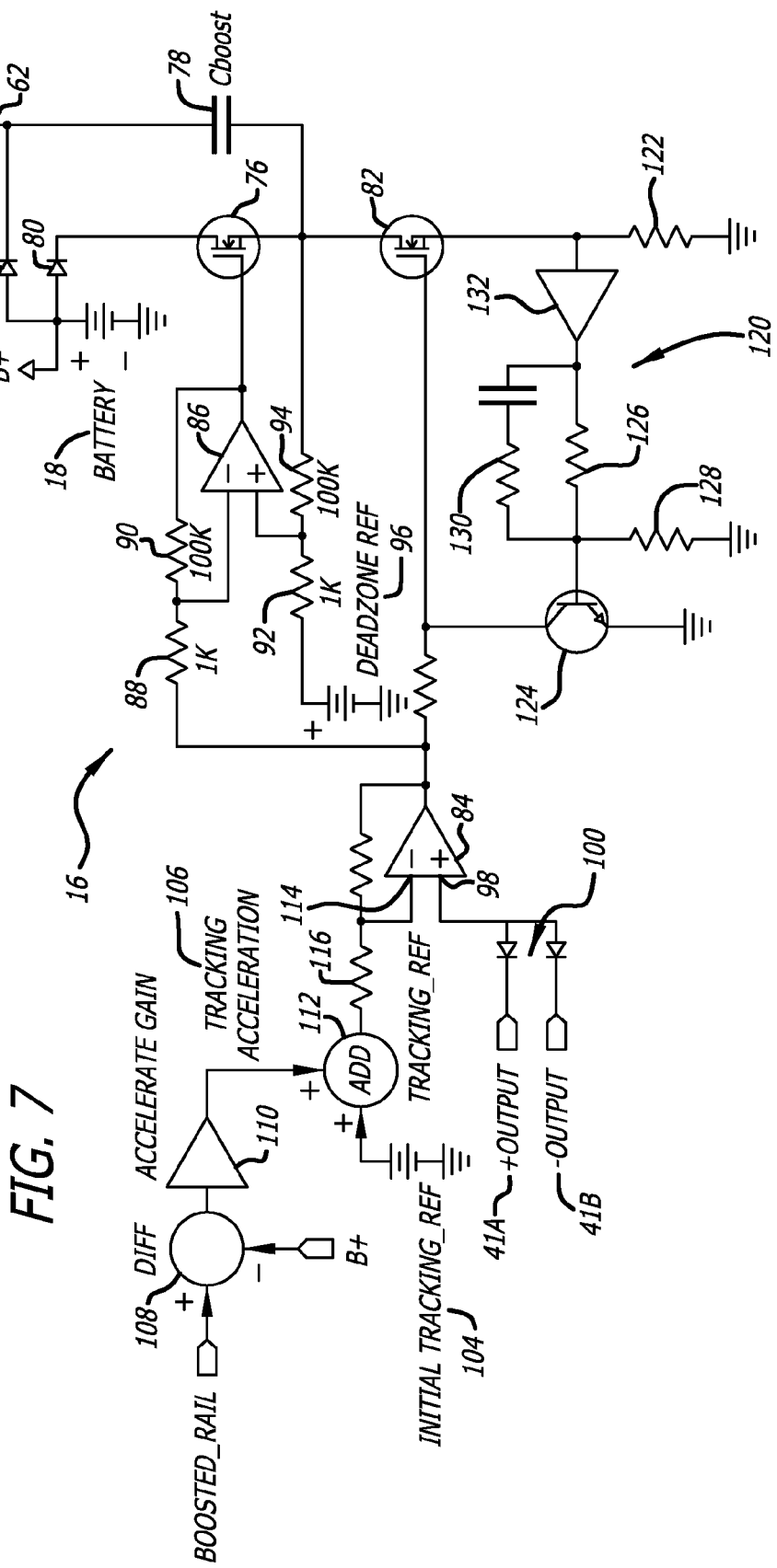
FIG. 7 depicts another embodiment of a boosted-rail circuit of the boosted rail amplifier including an inrush limiter circuit.

In another embodiment shown in FIG. 7, the boost-rail circuit 16 may also include an inrush limiter circuit 120. The inrush limiter circuit 120 controls the charging of capacitor Cboost 78. In this embodiment, the inrush limiter circuit 120 limits a peak amplitude of the charging current of capacitor Cboost 78. Without this type of circuit, the charging of capacitor Cboost 78 can result in high peak currents that may exceed component specifications or cause interference with other circuits that share the same battery voltage (B+) and ground conductors inside and outside the boosted-rail amplifier 10. Use of the inrush limiter circuit 120 may help in some applications that require compliance with various conducted emissions tests. It is desirable to adjust the inrush limiter circuit 120 to prevent it from degrading the rated power performance by not allowing the capacitor Cboost 78 to fully recharge during the non-boost (charge) operations.

Still referring to FIG. 7, the operation of the inrush limiter circuit 120 depends on the very low resistance resistor 122 to measure the charge current through the capacitor Cboost 78. If the charging current signal across resistor 122 exceeds the peak current limit it will turn on transistor 124, shunting gate-source voltage away from charge MOSFET 82 and turning it off. The peak current limit can be set by choosing the amplifier gain and values for resistor 122, resistor 126 and resistor 128 that will turn on the transistor 124 when the peak current limit flows through resistor 122. Some low-pass filtering of the charging current can be achieved by choosing appropriate values for the phase-lead circuit RC 130. An amplifier 132 is also included in the inrush limiter 120 that amplifies the charge current. The inrush limiter 120 may help with conducted emissions compliance by removing high-frequency content from the charging current waveform. Further improvements are possible through the use of active waveshaping, forced by feedback control of the charging current of the capacitor Cboost 78 measured at resistor 122.

Figure 8:
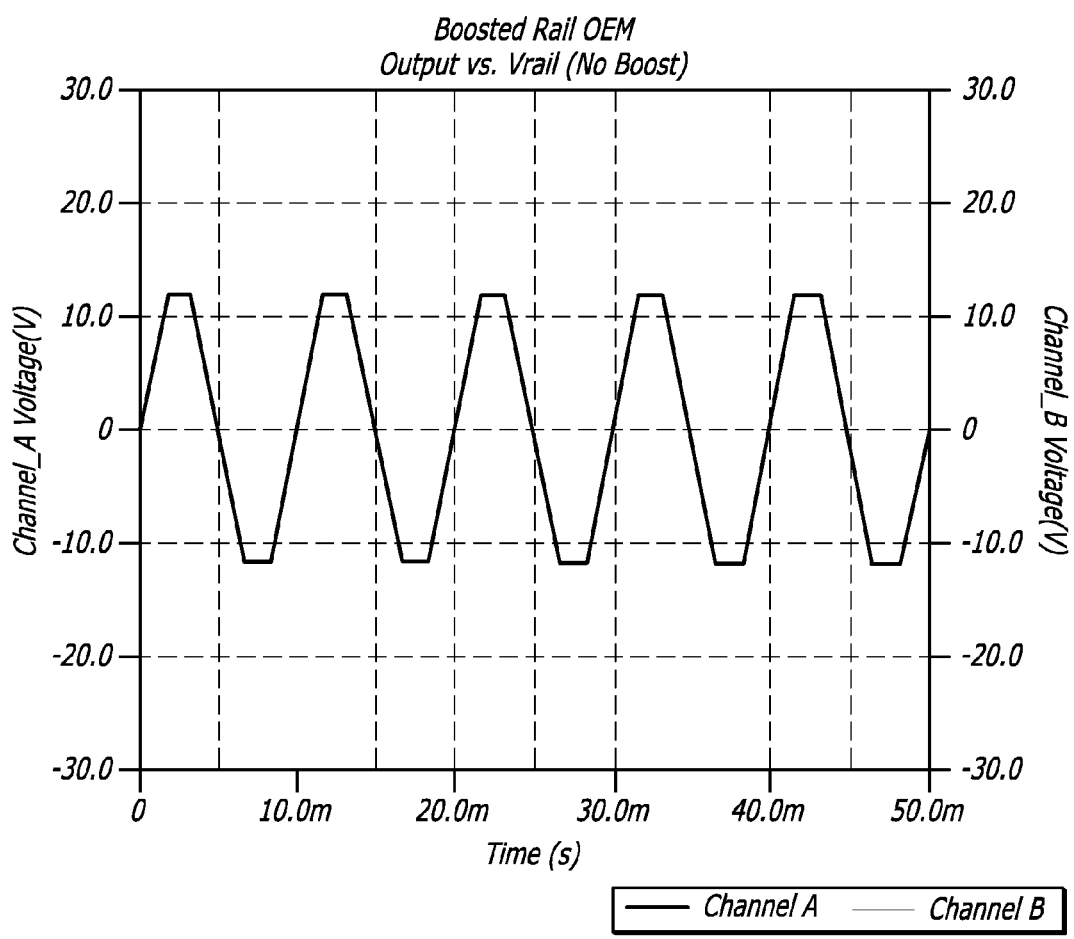
FIG. 8 depicts a graph of an output from a Class AB amplifier showing clipping of an output signal occurring at about 12 volts.
Figure 9:
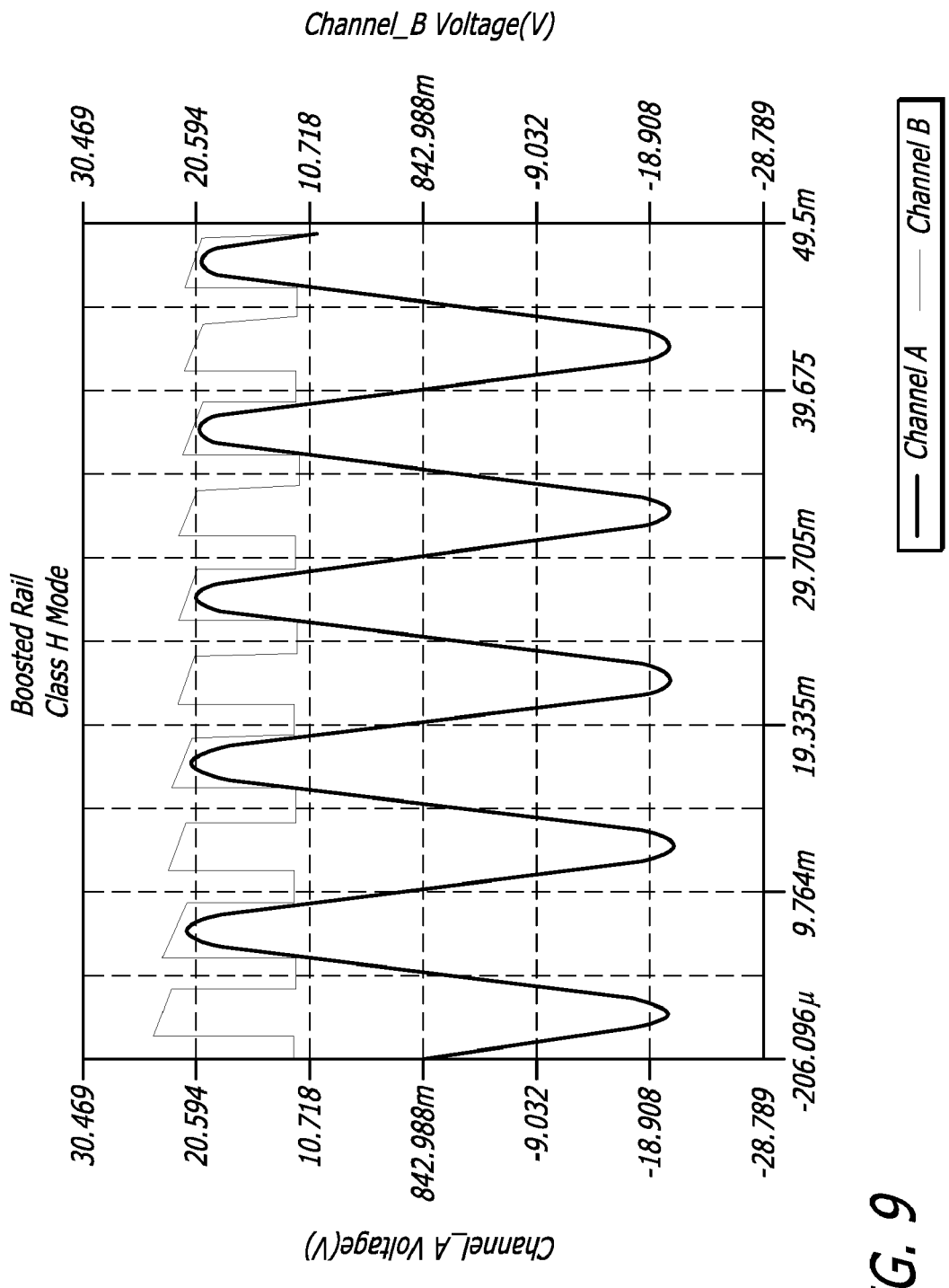
FIG. 9 depicts a graph of an output from an embodiment of the boosted-rail amplifier operating in a Class H mode.

The boosted-rail amplifier 10 has a higher efficiency than a standard Class AB amplifier without the boosted-rail circuit. For a given sampling of music, the boosted-rail amplifier has an efficiency average of about 40% to about 65%, while the standard Class AB amplifier has a efficiency average of about 30% to about 55%. Also, as shown in FIGS. 8 and 9, the boosted-rail amplifier 10 provides more power compared to the standard Class AB amplifier. FIG. 8 shows the voltage output over time of the standard Class AB amplifier. In the example shown in FIG. 8, 150 Watts of power are provided with an impedance of 0.5 ohms and a current of 17.3 Amps. With the standard Class AB amplifier, 75 Watts of power are provided with an impedance of 1 ohm and a current of 8.6 Amps. The output of the standard Class AB amplifier is shown to clip at about 12 volts.

The voltage output over time of the boosted-rail amplifier 10 is shown in FIG. 9. The waveform shown in FIG. 9 is similar to a waveform produced by a Class H amplifier. Clipping for the boosted-rail amplifier is shown to occur at a higher voltage than the standard Class AB amplifier. In the example shown in FIG. 9, the boosted-rail amplifier provides 300 Watts of power with an impedance of 1 ohm and a current of 17.3 Amps. Also, 150 Watts of power are provided by the boosted-rail amplifier when the impedance is 2 ohm and the current is 8.6 Amps.

Figure 10:
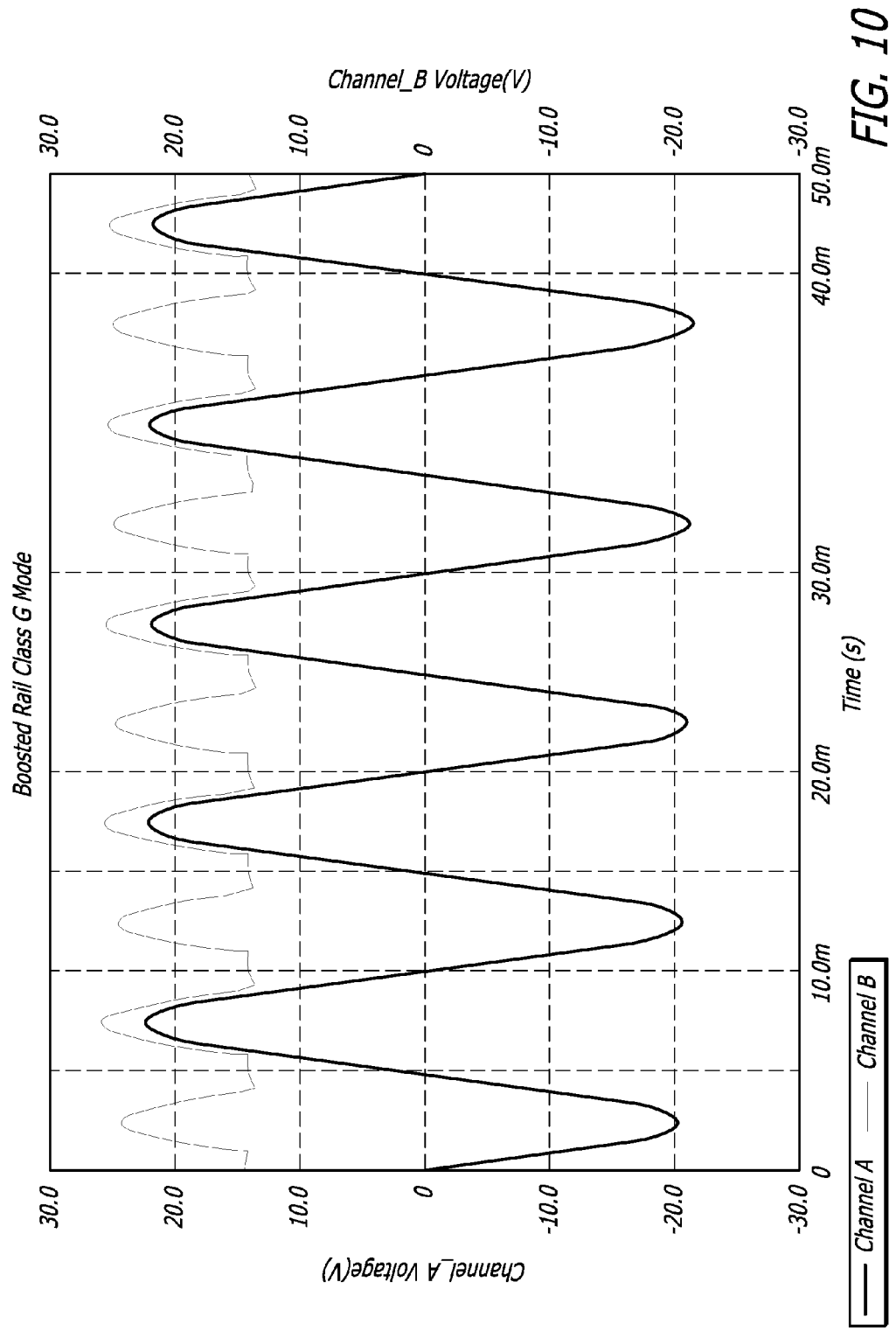
FIG. 10 depicts a graph of an output from an embodiment of the boosted-rail amplifier operating in a Class G mode.

Another waveform of the voltage output over time of the boosted-rail amplifier 10 is shown in FIG. 10 when the boosted-rail amplifier is run in Class G mode. Clipping for the boosted-rail amplifier is shown to occur at a higher voltage than the standard Class AB amplifier. In the example shown in FIG. 10, the boosted-rail amplifier provides 300 Watts of power with an impedance of 1 ohm and a current of 17.3 Amps. Also, 150 Watts of power are provided by the boosted-rail amplifier when the impedance is 2 ohm and the current is 8.6 Amps.

Figure 11:
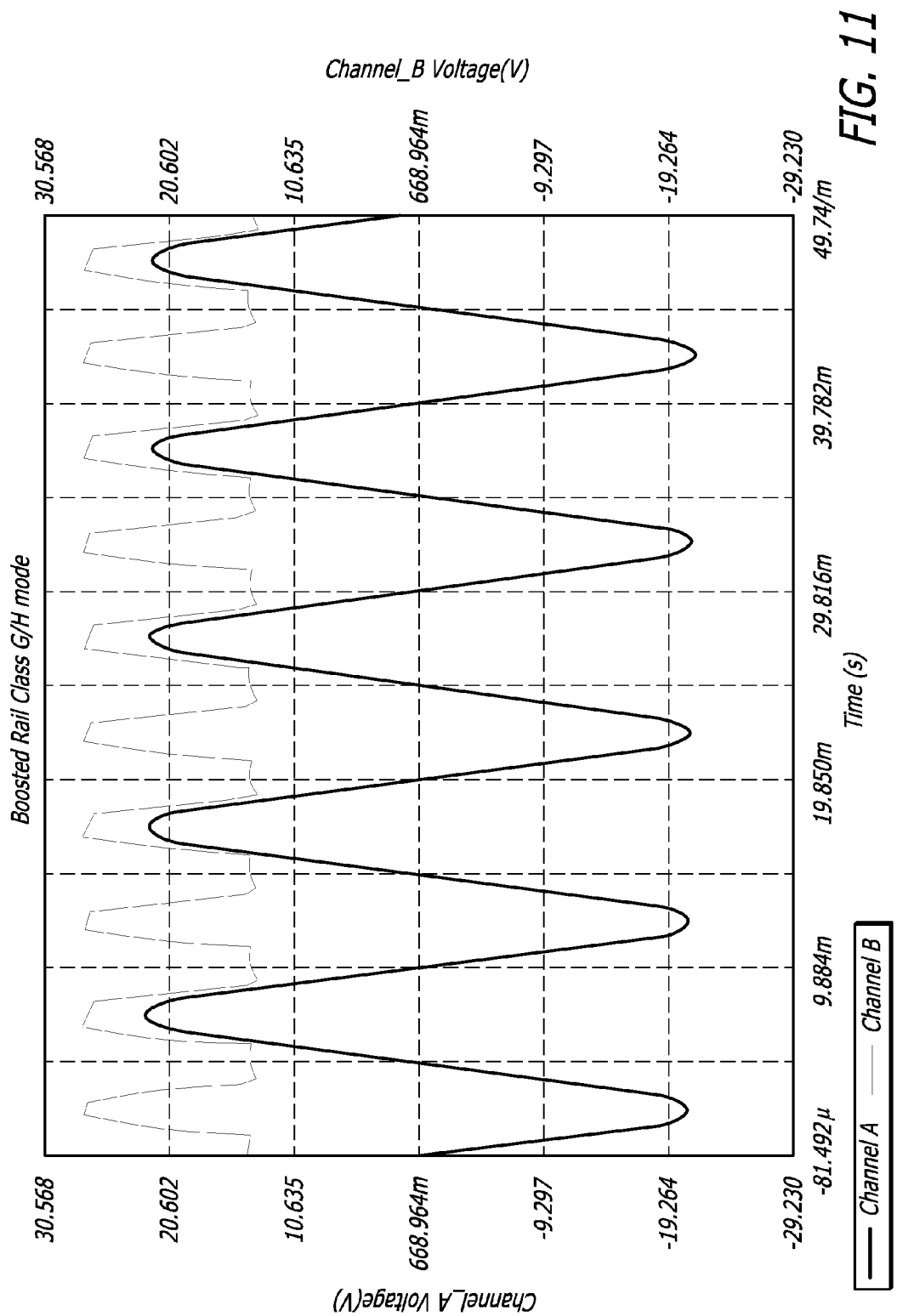
FIG. 11 depicts a graph of an output from an embodiment of the boosted-rail amplifier operating in a Class GH mode.

Referring now to FIG. 11, a waveform of the voltage output over time of the boosted-rail amplifier 10 is shown when the boosted-rail amplifier is run in Class GH mode. Operating in Class GH mode allows for a more even heat distribution between output and boost power devices. As shown, clipping in this for the boosted-rail amplifier for this example occurs at a higher voltage than the standard Class AB amplifier. In the example shown in FIG. 11, the boosted-rail amplifier provides 300 Watts of power with an impedance of 1 ohm and a current of 17.3 Amps. Also, 150 Watts of power are provided by the boosted-rail amplifier when the impedance is 2 ohm and the current is 8.6 Amps.

The various embodiments described above are provided by way of illustration only and should not be construed to limit the claimed invention. Those skilled in the art will readily recognize various modifications and changes that may be made to the claimed invention without following the example embodiments and applications illustrated and described herein, and without departing from the true spirit and scope of the claimed invention, which is set forth in the following claims.

What is claimed is:

1. An amplifier device, comprising:
    a BTL amplifier having an input for receiving an audio input signal and the BTL amplifier producing an output signal to a load;
    a boosted-rail circuit connected to a power source and having a boosted rail connected to the BTL amplifier, and the boosted-rail circuit supplying an output voltage to the BTL amplifier through the boosted rail in a non-boost mode and a boost mode;
    wherein the boosted-rail circuit reacts to the BTL amplifier and switches from the non-boost mode to the boost mode to increase the output voltage supplied to the BTL amplifier beyond the voltage of the power source when the BTL amplifier requires additional voltage; and
    a common-mode circuit in communication with the boosted-rail circuit and the BTL amplifier, the common-mode circuit sends a common-mode signal to the BTL amplifier that will dynamically track the output voltage supplied from the boosted-rail circuit to the BTL amplifier.

2. The device of claim 1, wherein the boosted-rail circuit has a single boosted rail connection to the BTL amplifier.

3. The device of claim 2, wherein the single boosted rail operates at twice audio signal frequency.

4. The device of claim 1, wherein the boosted-rail circuit switches from the non-boost mode to the boost mode when the boosted-rail circuit detects that one output signal from the BTL amplifier is near clipping.

5. The device of claim 4, wherein the boosted-rail circuit includes an error amplifier that detects when one output signal from the BTL amplifier is near clipping.

6. The device of claim 1, wherein the common-mode signal is one-half the amplitude of the power supplied from the boosted-rail circuit to the BTL amplifier.

7. The device of claim 1, wherein the boosted-rail circuit includes a boost capacitor that provides additional energy to the BTL amplifier through the boosted-rail when the boosted-rail circuit is in the boost mode.

8. The device of claim 7, wherein the boost capacitor charges when the boosted-rail circuit is in the non-boost mode.

9. The device of claim 8, wherein the boosted-rail circuit includes means for preventing the boosted-rail circuit from being in the boosted mode and charging the boost capacitor simultaneously.

10. The device of claim 1, wherein the amplifier device boosts its supply voltage and current equally in the boost mode.

11. The device of claim 1, further comprising an audio signal processing circuit connected to the BTL amplifier for providing the audio input signal.

12. The device of claim 1, wherein the boosted-rail circuit reacts to the output signal produced by the BTL amplifier and switches from the non-boost mode to the boost mode to increase the output voltage supplied to the BTL amplifier beyond the voltage of the power source when the BTL amplifier requires additional voltage.

13. The device of claim 1, wherein the boosted-rail circuit reacts to the audio input signal received by the BTL amplifier and switches from the non-boost mode to the boost mode to increase the output voltage supplied to the BTL amplifier beyond the voltage of the power source when the BTL amplifier requires additional voltage.

14. An amplifier device, comprising:
a BTL amplifier having an input for receiving an audio input signal and the BTL amplifier producing an output signal to a load;
an audio signal processing circuit connected to the BTL amplifier for providing the audio input signal;
a boosted-rail circuit connected to a power source and having a single boosted rail connected to the BTL amplifier, and the boosted-rail circuit supplying an output voltage to the BTL amplifier through the single boosted rail in a non-boost mode and a boost mode;
wherein the boosted-rail circuit monitors the BTL amplifier and switches from the non-boost mode to the boost mode to increase the output voltage to the BTL amplifier beyond the voltage of the power source when the BTL amplifier requires additional power; and
a common-mode circuit in communication with the boosted-rail circuit and the BTL amplifier, the common-mode circuit sends a common-mode signal to the BTL amplifier that will dynamically track the output voltage supplied from the boosted-rail circuit to the BTL amplifier.

15. The device of claim 14, wherein the common-mode signal is one-half the amplitude of the output voltage supplied from the boosted-rail circuit to the BTL amplifier.

16. The device of claim 14, wherein the single boosted rail operates at twice audio signal frequency.

17. The device of claim 14, wherein the boosted-rail circuit switches from the non-boost mode to the boost mode when the boosted-rail circuit detects that one output signal from the BTL amplifier is near clipping.

18. The device of claim 17, wherein the boosted-rail circuit includes an error amplifier that detects when one output signal from the BTL amplifier is near clipping.

19. The device of claim 14, wherein the boosted-rail circuit includes a boost capacitor that provides additional energy to the BTL amplifier through the boosted-rail when the boosted-rail circuit is in the boost mode.

20. The device of claim 19, wherein the boost capacitor charges when the boosted-rail circuit is in the non-boost mode.

21. The device of claim 20, wherein the boosted-rail circuit includes means for preventing the boosted-rail circuit from being in the boosted mode and charging the boost capacitor simultaneously.

22. The device of claim 14, wherein the boosted-rail circuit monitors the output signal produced by the BTL amplifier and switches from the non-boost mode to the boost mode to increase the output voltage supplied to the BTL amplifier beyond the voltage of the power source when the BTL amplifier requires additional voltage.

23. The device of claim 14, wherein the boosted-rail circuit monitors the audio input signal received by the BTL amplifier and switches from the non-boost mode to the boost mode to increase the output voltage supplied to the BTL amplifier beyond the voltage of the power source when the BTL amplifier requires additional voltage.

24. A method for increasing the voltage of an amplifier, comprising:
sending an audio signal to a BTL amplifier;
sending an output signal from the BTL amplifier to a load;
supplying an output voltage from a boosted-rail circuit having a boosted-rail to the BTL amplifier in a non-boost mode and a boost mode, wherein the boosted-rail circuit is connected to a power source;
monitoring the BTL amplifier with the boosted-rail circuit and switching the boosted-rail circuit from the non-boost mode to the boost mode to increase the output voltage to the BTL amplifier beyond the voltage of the power source when the BTL amplifier requires additional voltage; and
sending a common-mode signal to the BTL amplifier for dynamically tracking the output voltage supplied from the boosted-rail circuit to the BTL amplifier.

25. The method of claim 14, wherein the common-mode signal is one-half the amplitude of the output voltage supplied from the boosted-rail circuit to the BTL amplifier.

26. The method of claim 24, further comprising charging a boost capacitor disposed in the boosted-rail circuit when supplying the output voltage to the BTL amplifier in the non-boost mode.

27. The method of claim 26, wherein increasing the output voltage from the boosted-rail circuit in the boost mode to the BTL amplifier providing additional energy from the boost capacitor to the BTL amplifier through the boosted-rail.

28. The method of claim 24, wherein switching the boosted-rail circuit from the non-boost mode to the boost mode when the boosted-rail circuit detects that one output signal from the BTL amplifier is near clipping.

29. The device of claim 24, wherein monitoring the output signal produced by the BTL amplifier and switching the boosted-rail circuit from the non-boost mode to the boost mode to increase the output voltage supplied to the BTL amplifier beyond the voltage of the power source when the BTL amplifier requires additional voltage.

30. The device of claim 24, wherein monitoring the audio input signal received by the BTL amplifier and switching the boosted-rail circuit from the non-boost mode to the boost mode to increase the output voltage supplied to the BTL amplifier beyond the voltage of the power source when the BTL amplifier requires additional voltage.

* * * * *